(12) United States Patent
Nanba et al.

(10) Patent No.: US 8,043,467 B2
(45) Date of Patent: Oct. 25, 2011

(54) LIQUID PROCESSING APPARATUS AND LIQUID PROCESSING METHOD

(75) Inventors: Hiromitsu Nanba, Koshi (JP); Masahiro Yoshida, Koshi (JP); Yuji Murakami, Koshi (JP); Hiroshi Nagayasu, Kasuga (JP)

(73) Assignee: Tokyo Electron Limited, Tokyo (JP)

( * ) Notice: Subject to any disclaimer, the term of this patent is extended or adjusted under 35 U.S.C. 154(b) by 1104 days.

(21) Appl. No.: 11/727,656

(22) Filed: Mar. 27, 2007

(65) Prior Publication Data

US 2007/0231483 A1    Oct. 4, 2007

(30) Foreign Application Priority Data

Mar. 28, 2006   (JP) ................. 2006-089285

(51) Int. Cl.
*H01L 21/027* (2006.01)
*G03F 7/30* (2006.01)

(52) U.S. Cl. ............... 156/345.13; 156/345.55; 118/320

(58) Field of Classification Search ............ 156/345.55, 156/345.11, 345.15, 345.13; 134/33; 427/240, 427/427.3; 118/52, 320, 323
See application file for complete search history.

(56) References Cited

U.S. PATENT DOCUMENTS

| | | | |
|---|---|---|---|
| 5,499,733 A | 3/1996 | Litvak | |
| 6,096,233 A | 8/2000 | Taniyama et al. | |
| 6,884,294 B2 * | 4/2005 | Minami et al. | 427/240 |
| 6,964,724 B2 * | 11/2005 | Yamasaki et al. | 156/345.21 |
| 2003/0129850 A1 | 7/2003 | Olgado et al. | |
| 2003/0196683 A1 | 10/2003 | Izumi et al. | |
| 2004/0062861 A1 * | 4/2004 | Sato | 427/240 |
| 2007/0137677 A1 * | 6/2007 | Nanba | 134/33 |
| 2007/0231483 A1 * | 10/2007 | Nanba et al. | 427/240 |

FOREIGN PATENT DOCUMENTS

JP       2004-6672       1/2004

OTHER PUBLICATIONS

Korean Office Action issued on Jan. 18, 2011 for Application No. 10-2007-0029758 w/ partial English language translation.

* cited by examiner

*Primary Examiner* — Sylvia R. MacArthur
(74) *Attorney, Agent, or Firm* — Smith, Gambrell & Russell, LLP

(57) ABSTRACT

A liquid processing apparatus is arranged to planarize a film on a substrate by supplying onto the film a process liquid for dissolving the film while rotating the substrate. The apparatus includes a substrate holding member configured to rotatably hold the substrate in a horizontal state, a rotation mechanism configured to rotate the substrate holding member, and a liquid supply mechanism configured to supply the process liquid onto a surface of the substrate. The liquid supply mechanism includes first and second liquid delivery nozzles configured to deliver the same process liquid. The first liquid delivery nozzle has a smaller diameter and provides a smaller delivery flow rate, as compared to the second liquid delivery nozzle. The first liquid delivery nozzle is inclined to deliver the process liquid in a rotational direction of the substrate, and is movable between a center of the substrate and a peripheral edge thereof.

26 Claims, 6 Drawing Sheets

LIQUID PROCESSING APPARATUS AND LIQUID PROCESSING METHOD

BACKGROUND OF THE INVENTION

1. Field of the Invention

The present invention relates to a liquid processing apparatus and liquid processing method for planarizing a film on a substrate, such as a semiconductor wafer, by use of a process liquid.

2. Description of the Related Art

In general, in the process of manufacturing semiconductor devices, thin films, such as oxide films and nitride films, are formed as insulating films on the surface of a target substrate, such as a semiconductor wafer (which will be simply referred to as a wafer, hereinafter). As a method for forming a thin film, chemical vapor deposition (CVD) methods are utilized. In CVD methods, where a source gas is supplied from outside a wafer, as in a film formation process of the batch type performed in a vertical furnace, the thickness of a film thereby formed becomes larger at the peripheral portion of the wafer than at the central portion thereof, i.e., a concave shape (cone-shaped recess) is formed on the film. Further, where a film formation method other than CVD of the batch type is used, the thickness of a film thereby formed may become larger at the central portion, i.e., a convex shape (cone-shaped projection) may be formed on the film. Where contact holes are formed in a film having such a less uniform thickness, the diameter of the contact holes becomes smaller at a position with a film thickness larger than a predetermined value, while the diameter becomes larger at a position with a film thickness smaller than the predetermined value. If the diameters of the contact holes are different, a problem arises in that the product yield is decreased.

As a technique to solve this problem, U.S. Pat. No. 6,096,233 discloses the following technique. Specifically, at first, the thickness of a film, such as an oxide film, formed on a semiconductor wafer is detected at least at the peripheral and central portions of the film. Then, in accordance with detection signals, the film is planarized by supplying a process liquid (for example, hydrofluoric acid solution) that dissolves (etches) the film onto the wafer. At this time, the wafer is rotated, while a nozzle for supplying the process liquid is moved from the peripheral portion to the central portion of the wafer.

However, according to the technique disclosed in U.S. Pat. No. 6,096,233, liquid flicks occur at the peripheral portion of a wafer near a wafer chuck for holding the wafer. Consequently, a process liquid may be unevenly supplied onto the inner area of a film on the wafer, thereby deteriorating the uniformity of etching. Further, at the peripheral portion of the wafer near the wafer chuck, liquid supply is disturbed by the wafer chuck, thereby deteriorating the uniformity of etching, i.e., lowering the accuracy of the film thickness. In addition, since the process liquid is supplied while a nozzle for supplying the process liquid is moved for scanning, the process liquid consumption is large. Accordingly, it is also required to decrease the process liquid consumption.

BRIEF SUMMARY OF THE INVENTION

An object of the present invention is to provide a liquid processing apparatus and liquid processing method that can accurately dissolve a film formed on a substrate, even near the outer edge of the substrate.

Another object of the present invention is to provide a liquid processing apparatus and liquid processing method that can hardly deteriorate the uniformity of a dissolving process due to process liquid flicks.

Another object of the present invention is to provide a liquid processing apparatus and liquid processing method that can decrease the process liquid consumption.

Another object of the present invention is to provide a storage medium that store a program for performing any one of these methods.

According to a first aspect of the present invention, there is provided a liquid processing apparatus arranged to planarize a film on a substrate by supplying onto the film a process liquid for dissolving the film while rotating the substrate, the apparatus comprising: a substrate holding member configured to rotatably hold the substrate in a horizontal state; a rotation mechanism configured to rotate the substrate holding member; and a liquid supply mechanism configured to supply the process liquid onto a surface of the substrate, wherein the liquid supply mechanism includes a first liquid delivery nozzle and a second liquid delivery nozzle, which are configured to deliver the same process liquid, the first liquid delivery nozzle has a smaller diameter and provides a smaller delivery flow rate, as compared to the second liquid delivery nozzle, the first liquid delivery nozzle is inclined to deliver the process liquid in a rotational direction of the substrate, and is movable between a center of the substrate and a peripheral edge thereof.

According to a second aspect of the present invention, there is provided a liquid processing apparatus arranged to planarize a film on a substrate by supplying onto the film a process liquid for dissolving the film while rotating the substrate, the apparatus comprising: a substrate holding member configured to rotatably hold the substrate in a horizontal state; a rotation mechanism configured to rotate the substrate holding member; and a liquid supply mechanism configured to supply the process liquid onto a surface of the substrate, wherein the liquid supply mechanism includes a first liquid delivery nozzle and a second liquid delivery nozzle, which are configured to switchably deliver the same process liquid and the same rinsing liquid, the first liquid delivery nozzle has a smaller diameter and provides a smaller delivery flow rate, as compared to the second liquid delivery nozzle, the first liquid delivery nozzle is inclined to deliver the process liquid in a rotational direction of the substrate, and is movable between a center of the substrate and a peripheral edge thereof.

According to a third aspect of the present invention, there is provided a liquid processing method for dissolving a film on a substrate by a predetermined process liquid while rotating the substrate, by use of a first liquid delivery nozzle and a second liquid delivery nozzle arranged such that the first liquid delivery nozzle has a smaller diameter and provides a smaller delivery flow rate, as compared to the second liquid delivery nozzle, and the first liquid delivery nozzle is inclined to deliver the process liquid in a rotational direction of the substrate, the method comprising: causing the first liquid delivery nozzle to travel in a radial direction of the substrate and to deliver the process liquid onto the film, thereby uniformizing thickness of the film; and then causing the second liquid delivery nozzle to supply the process liquid onto the film, thereby further dissolving the film to a predetermined thickness while maintaining uniformity in film thickness.

According to a fourth aspect of the present invention, there is provided a liquid processing method for dissolving a film, which has a profile defined by a thickness smaller at a central portion than at a peripheral portion, on a substrate by a predetermined process liquid while rotating the substrate, by use of a first liquid delivery nozzle and a second liquid delivery nozzle arranged such that the first liquid delivery nozzle has a smaller diameter and provides a smaller delivery flow rate, as compared to the second liquid delivery nozzle, and the first liquid delivery nozzle is inclined to deliver the process liquid in a rotational direction of the substrate, the method comprising: causing the first liquid delivery nozzle to travel from a peripheral edge of the film to a center thereof or a center of the film to a peripheral edge thereof and to deliver the process liquid onto the film, thereby uniformizing thickness of the film, in accordance with the profile of the film; then causing the second liquid delivery nozzle to supply the process liquid onto the film, thereby further dissolving the film to a predetermined thickness while maintaining uniformity in film thickness; and then causing the second liquid delivery nozzle to supply a rinsing liquid onto the film, thereby stopping the process liquid from dissolving the film.

According to a fifth aspect of the present invention, there is provided a liquid processing method for dissolving a film, which has a profile defined by a thickness larger at a central portion than at a peripheral portion, on a substrate by a predetermined process liquid while rotating the substrate, by use of a first liquid delivery nozzle and a second liquid delivery nozzle arranged such that the first liquid delivery nozzle has a smaller diameter and provides a smaller delivery flow rate, as compared to the second liquid delivery nozzle, and the first liquid delivery nozzle is inclined to deliver the process liquid in a rotational direction of the substrate, the method comprising: causing the second liquid delivery nozzle to be located at a center of the film and to deliver the process liquid onto the film, thereby dissolving the film by essentially the same thickness all over the film; and then causing the first liquid delivery nozzle to travel from a peripheral edge of the film to a center thereof and to deliver a rinsing liquid onto the film, thereby sequentially stopping dissolution of the film and uniformizing thickness of the film, in accordance with the profile of the film.

According to a sixth aspect of the present invention, there is provided a storage medium that stores a program for execution on a computer to control a liquid processing apparatus, wherein the program, when executed by the computer, controls the apparatus to perform a liquid processing method for dissolving a film on a substrate by a predetermined process liquid while rotating the substrate, by use of a first liquid delivery nozzle and a second liquid delivery nozzle arranged such that the first liquid delivery nozzle has a smaller diameter and provides a smaller delivery flow rate, as compared to the second liquid delivery nozzle, and the first liquid delivery nozzle is inclined to deliver the process liquid in a rotational direction of the substrate, the method comprising: causing the first liquid delivery nozzle to travel in a radial direction of the substrate and to deliver the process liquid onto the film, thereby uniformizing thickness of the film; and then causing the second liquid delivery nozzle to supply the process liquid onto the film, thereby further dissolving the film to a predetermined thickness while maintaining uniformity in film thickness.

According to a seventh aspect of the present invention, there is provided a storage medium that stores a program for execution on a computer to control a liquid processing apparatus, wherein the program, when executed by the computer, controls the apparatus to perform a liquid processing method for dissolving a film, which has a profile defined by a thickness smaller at a central portion than at a peripheral portion, on a substrate by a predetermined process liquid while rotating the substrate, by use of a first liquid delivery nozzle and a second liquid delivery nozzle arranged such that the first liquid delivery nozzle has a smaller diameter and provides a smaller delivery flow rate, as compared to the second liquid delivery nozzle, and the first liquid delivery nozzle is inclined to deliver the process liquid in a rotational direction of the substrate, the method comprising: causing the first liquid delivery nozzle to travel from a peripheral edge of the film to a center thereof or a center of the film to a peripheral edge thereof and to deliver the process liquid onto the film, thereby uniformizing thickness of the film, in accordance with the profile of the film; then causing the second liquid delivery nozzle to supply the process liquid onto the film, thereby further dissolving the film to a predetermined thickness while maintaining uniformity in film thickness; and then causing the second liquid delivery nozzle to supply a rinsing liquid onto the film, thereby stopping the process liquid from dissolving the film.

According to an eighth aspect of the present invention, there is provided a storage medium that stores a program for execution on a computer to control a liquid processing apparatus, wherein the program, when executed by the computer, controls the apparatus to perform a liquid processing method for dissolving a film, which has a profile defined by a thickness larger at a central portion than at a peripheral portion, on a substrate by a predetermined process liquid while rotating the substrate, by use of a first liquid delivery nozzle and a second liquid delivery nozzle arranged such that the first liquid delivery nozzle has a smaller diameter and provides a smaller delivery flow rate, as compared to the second liquid delivery nozzle, and the first liquid delivery nozzle is inclined to deliver the process liquid in a rotational direction of the substrate, the method comprising: causing the second liquid delivery nozzle to be located at a center of the film and to deliver the process liquid onto the film, thereby dissolving the film by essentially the same thickness all over the film; and then causing the first liquid delivery nozzle to travel from a peripheral edge of the film to a center thereof and to deliver a rinsing liquid onto the film, thereby sequentially stopping dissolution of the film and uniformizing thickness of the film, in accordance with the profile of the film.

According to the present invention, since the first liquid delivery nozzle has a smaller diameter and delivers a liquid at a smaller flow rate, it is possible to accurately control the liquid supply point, when the process liquid is delivered to perform etching.

Further, since such a nozzle having a smaller diameter is used, the consumption of the process liquid can be decreased. Furthermore, since the first liquid delivery nozzle is inclined to deliver a liquid in the rotational direction of the substrate, the relative liquid velocity is decreased, thereby suppressing liquid flicks and/or liquid spread. Where the first liquid delivery nozzle having a smaller diameter and providing a smaller flow rate is first used to planarize a film, and the second liquid delivery nozzle having a larger diameter and providing a larger flow rate is then used to promote etching, the film can be dissolved at a high rate.

Where the first and second liquid delivery nozzles are configured to switchably deliver both of the process liquid and rinsing liquid, it is possible to perform a dissolving process in various variations.

DETAILED DESCRIPTION OF THE INVENTION

An embodiment of the present invention will now be described with reference to the accompanying drawings. In this embodiment, the present invention is applied to a liquid processing apparatus for etching (dissolving) an oxide film formed on a wafer.

Figure 1:
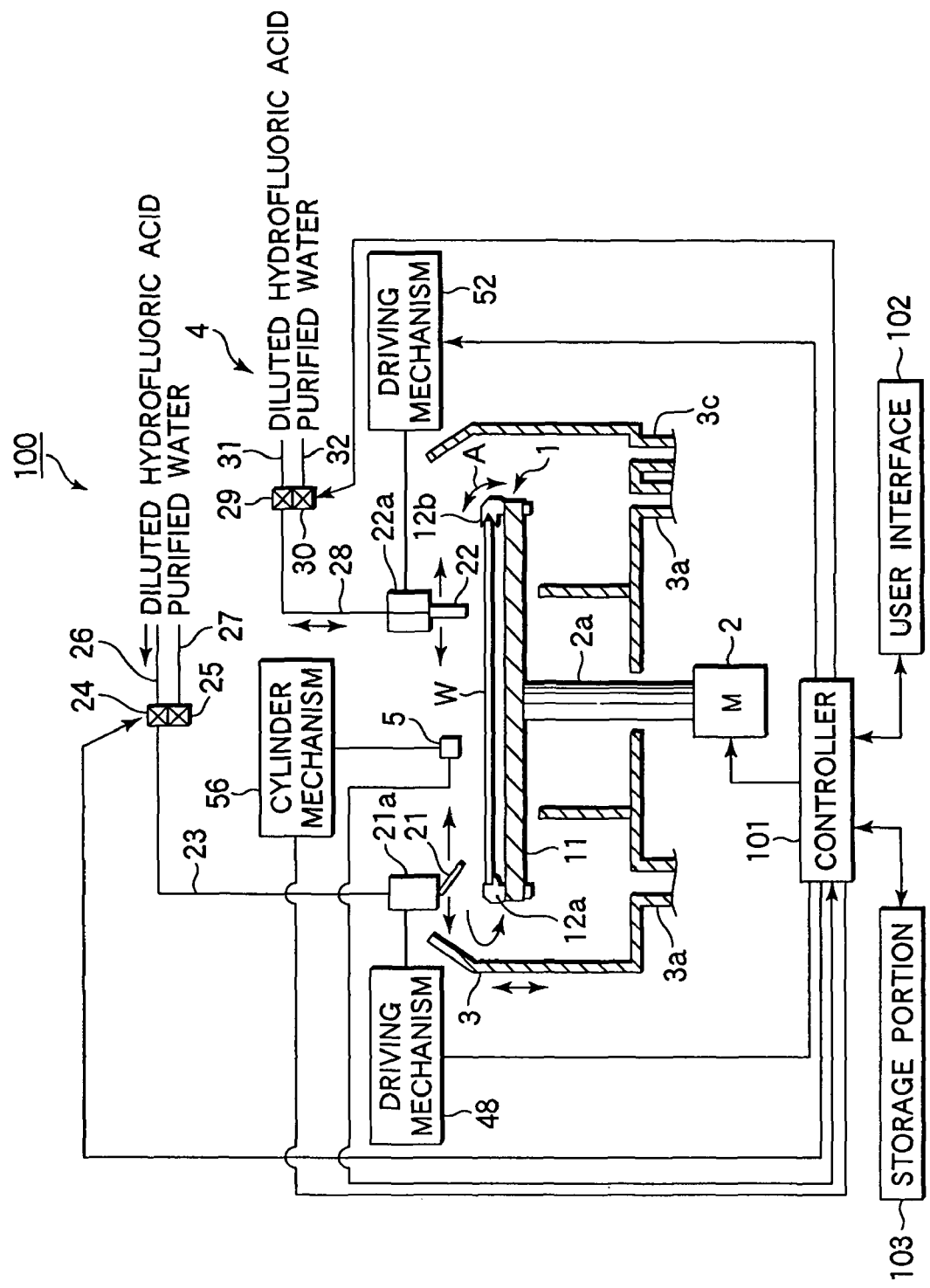
FIG. 1 is a sectional view, schematically showing the structure of a liquid processing apparatus according to an embodiment of the present invention.
Figure 2:
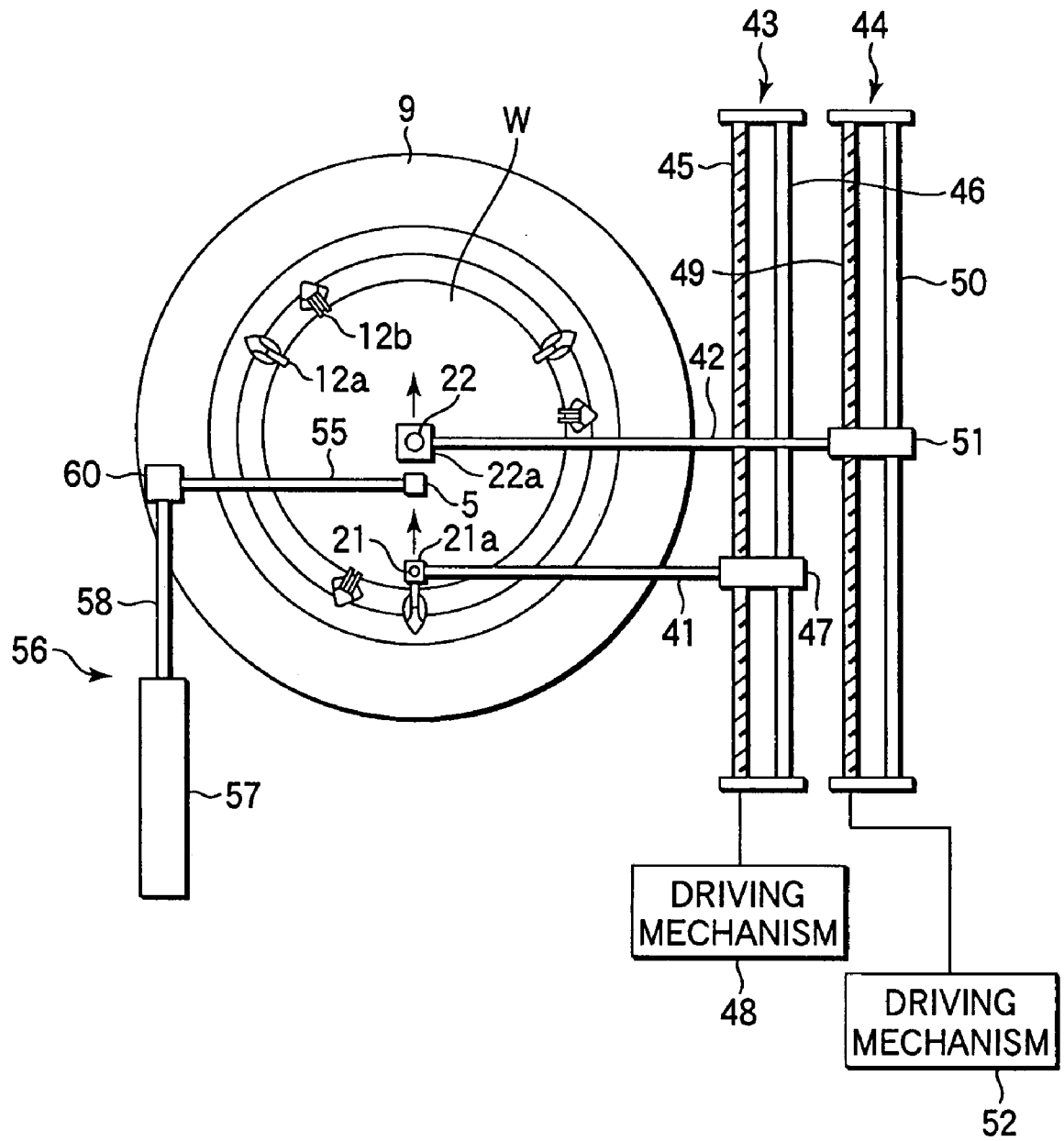
FIG. 2 is a plan view schematically showing the structure of the liquid processing apparatus according to the embodiment of the present invention.

FIGS. 1 and 2 are a sectional view and a plan view, respectively, schematically showing the structure of a liquid processing apparatus according to an embodiment of the present invention. This liquid processing apparatus 100 includes a wafer holding member 1 for rotatably holding a target substrate or wafer W with an oxide film formed thereon. The wafer holding member 1 is rotatable by a rotary motor 2. A cup 3 is disposed to surround the wafer W placed on the wafer holding member 1. The liquid processing apparatus 100 further includes a liquid supply mechanism 4 for supplying a dissolvent solution and purified water onto the wafer W, and a film thickness sensor 5 for measuring the thickness of the oxide film on the wafer W.

The wafer holding member 1 includes a rotary plate 11 directly connected to the shaft 2a of the rotary motor 2. The rotary plate 11 is provided with three support pins 12a for supporting the wafer W and three hold pins 12b for holding the wafer W, which are attached to the peripheral portion of the rotary plate 11. When the wafer W is transferred to and from the wafer holding member 1, the support pins 12a are utilized for this transfer. The hold pins 12b are rotatable in a direction indicated with an arrow A between an outer retreat position and a hold position for holding the wafer W, so that the hold pins 12b do not obstruct operations for transferring the wafer W between a transfer arm (not shown) and the wafer holding member 1. Specifically, the hold pins 12b are set in the retreat position when the support pins 12a receive the wafer W, and then the hold pins 12b are rotated to the hold position, thereby holding the wafer W. The wafer holding member 1 is movable up and down by an elevating mechanism (not shown).

The liquid supply mechanism 4 includes a first liquid delivery nozzle 21 and a second liquid delivery nozzle 22, each of which is movable for scanning between the center and peripheral edge of the wafer W. Each of the first and second liquid delivery nozzles 21 and 22 is arranged to selectively deliver diluted hydrofluoric acid (DHF) used as a process liquid for performing a dissolving process, and purified water used as a rinsing liquid. Specifically, the first liquid delivery nozzle 21 is connected to a first liquid supply line 23. The first liquid supply line 23 is connected to a diluted hydrofluoric acid supply line 26 and a purified water supply line 27 respectively through valves 24 and 25. Accordingly, diluted hydrofluoric acid used as a dissolvent solution and purified water used as a rinsing liquid can be delivered through the first liquid delivery nozzle 21 onto the surface of the wafer W. For the first liquid delivery nozzle 21, switching between the diluted hydrofluoric acid and purified water is performed by turning on/off the valves 24 and 25. The second liquid delivery nozzle 22 is connected to a second liquid supply line 28. The second liquid supply line 28 is connected to a diluted hydrofluoric acid supply line 31 and a purified water supply line 32 respectively through valves 29 and 30. Accordingly, diluted hydrofluoric acid used as a dissolvent solution and purified water used as a rinsing liquid can be delivered through the second liquid delivery nozzle 22 onto the surface of the wafer W, as in the first liquid delivery nozzle 21. For the second liquid delivery nozzle 22, switching between the diluted hydrofluoric acid and purified water is performed by turning on/off the valves 29 and 30. The diluted hydrofluoric acid supply lines 26 and 31 are connected to a liquid supply pump and a flow rate control unit (not shown). Similarly, the purified water supply lines 27 and 32 are connected to a liquid supply pump and a flow rate control unit (not shown).

Figure 3:
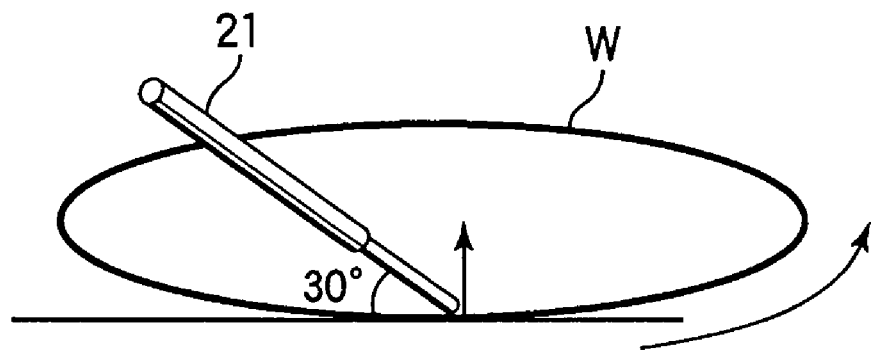
FIG. 3 is a view schematically showing the arrangement of a first liquid delivery nozzle used in the liquid processing apparatus shown in FIG. 1.

The first liquid delivery nozzle 21 is designed to have a smaller diameter and thus provide a smaller delivery flow rate, as compared to the second liquid delivery nozzle 22. For example, the first liquid delivery nozzle 21 has an inner diameter 0.5 mmφ and provides a flow rate of 50 mL/min. The second liquid delivery nozzle 22 has an inner diameter 4 mmφ and provides a flow rate of 500 mL/min. The first liquid delivery nozzle 21 preferably has a diameter of 0.2 to 2 mm, and preferably provides a delivery flow rate of 20 to 200 mL/min. Further, the second liquid delivery nozzle 22 preferably has a diameter of 3 to 5 mm, and preferably provides a delivery flow rate of 300 to 2,000 mL/min. Further, as shown in FIG. 3, the first liquid delivery nozzle 21 is inclined to deliver a process liquid in the rotational direction of the wafer W. This inclination angle is preferably set to be 15 to 75°, such as 30°. The second liquid delivery nozzle 22 is set in a vertical state as in the conventional nozzle, but may be set in an inclined state.

Since the first liquid delivery nozzle 21 has a smaller diameter and delivers a liquid at a smaller flow rate, it is possible to accurately control the liquid supply point and to decrease the liquid consumption. Further, since the first liquid delivery nozzle 21 is inclined to deliver a liquid in the rotational direction of the wafer W, the relative liquid velocity is decreased, thereby suppressing liquid flicks and/or liquid spread.

The first liquid delivery nozzle 21 is held by a first nozzle holder 21a attached to a first nozzle arm 41. As shown in FIG. 2, the first nozzle arm 41 is linearly movable between the center and peripheral edge of the wafer W by a ball screw mechanism 43. The ball screw mechanism 43 includes a ball screw 45 extending in the traveling direction of the first nozzle arm 41, and a guide rail 46 disposed in parallel with the ball screw 45. The first nozzle arm 41 is attached to a traveling member 47, which is screwed on the ball screw 45 and is slidably fitted on the guide rail 46. A driving mechanism 48 is disposed to rotate the ball screw 45, thereby linearly moving the traveling member 47.

The second liquid delivery nozzle 22 is held by a second nozzle holder 22a attached to a second nozzle arm 42. As shown in FIG. 2, the second nozzle arm 42 is linearly movable between the center and peripheral edge of the wafer W by a ball screw mechanism 44. The ball-screw mechanism 44 includes a ball screw 49 extending in the traveling direction of the second nozzle arm 42, and a guide rail 50 disposed in parallel with the ball screw 49. The second nozzle arm 42 is attached to a traveling member 51, which is screwed on the ball screw 49 and is slidably fitted on the guide rail 50. A driving mechanism 52 is disposed to rotate the ball screw 49, thereby linearly moving the traveling member 51. The first and second liquid delivery nozzles 21 and 22 may be moved by a mechanism other than the ball screw mechanism. For example, a belt driving mechanism or cylinder mechanism may be used for this purpose.

The cup 3 is configured to receive the process liquid or rinsing liquid separated from the wafer W by a centrifugal force during a process, and to drain it out of the apparatus. The cup 3 is provided with an exhaust passage 3a and two drain tubes 3b and 3c disposed at the bottom. The exhaust passage 3a is connected to the suction side of a gas exhaust pump (not shown). The cup 3 is movable up and down by an elevating mechanism (not shown).

The film thickness sensor 5 is arranged to detect the thickness of an oxide film formed on the wafer W, without coming into contact with the wafer W. For example, the film thickness sensor 5 is formed of an optical type thickness-meter or ellipsometer. The film thickness sensor 5 is attached to the distal end of an arm 55, which is linearly movable by a cylinder mechanism 56. Accordingly, the film thickness sensor 5 can be set at any position above the wafer W between the center and peripheral edge of the wafer W. The cylinder mechanism 56 comprises a cylinder 57 with a piston 58 movable outward and inward relative to the cylinder 57. The arm 55 is attached to a traveling member 60 fixed at the distal end of the piston 58.

Each of the components in the liquid processing apparatus 100 is connected to and controlled by a controller 101 comprising a micro-processor (computer). The controller 101 is connected to a user interface 102, which includes, e.g., a keyboard and a display, wherein the keyboard is used for a process operator to input commands for operating the components in the liquid processing apparatus 100, and the display is used for showing visualized images of the operational status of the components in the liquid processing apparatus 100. Further, the controller 101 is connected to the storage portion 103, which stores recipes with control programs and process condition data recorded therein, for realizing various processes performed in the liquid processing apparatus 100 under the control of the controller 101, and also stores other data necessary for the other control.

A required recipe is retrieved from the storage portion 103 and executed by the controller 101 in accordance with an instruction or the like input through the user interface 102. Consequently, each of various predetermined processes is performed in the liquid processing apparatus 100 under the control of the controller 101. A recipe may be stored in a readable storage medium, such as a CD-ROM, hard disk, flexible disk, or nonvolatile memory. Further, a recipe may be utilized on-line, while it is transmitted from a suitable apparatus through, e.g., a dedicated line, as needed.

Further, the controller 101 is arranged to receive detection data (signals) detected by the film thickness sensor 5. In the controller 101, the detection data is processed by an arithmetic comparison operation with reference to etching rate data (preset etching rates) of an oxide film obtained by, e.g., an experiment in advance. The result of this process is used to control the rotation number of the wafer W, the scanning velocity of a nozzle in supplying the process liquid, and the flow rates of the process liquid and purified water used as a rinsing liquid.

Next, an explanation will be given of an etching process (dissolving process) performed in the liquid processing apparatus having the structure described above.

At first, the type of an oxide film 110, the composition of the process liquid, and the relationship between the temperature and etching rate are stored in the storage portion 103 in advance. Then, a wafer W with an oxide film formed on its surface is transferred by a transfer arm (not shown) onto the support pins 12a of the wafer holding member 1. Thereafter, the wafer W is held by the hold pins 12b. In this state, the film thickness is measured by the film thickness sensor 5 at a plurality of points between the center and peripheral edge of the wafer W to obtain a profile of the film thickness.

Figure 4:
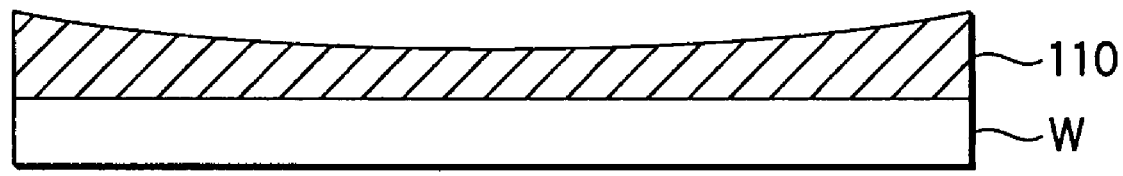
FIG. 4 is a view showing a case where an oxide film formed on a wafer has a thickness larger at the peripheral edge than at the center, which defines a cone-shaped recess profile.

As a result of the measurement, as shown in FIG. 4, if the oxide film 110 formed on the wafer W has a thickness larger at the peripheral edge than at the center, which defines a cone-shaped recess profile, the etching process (dissolving process) is performed in accordance with the steps shown in FIGS. 5A to 5E.

Figure 5A:
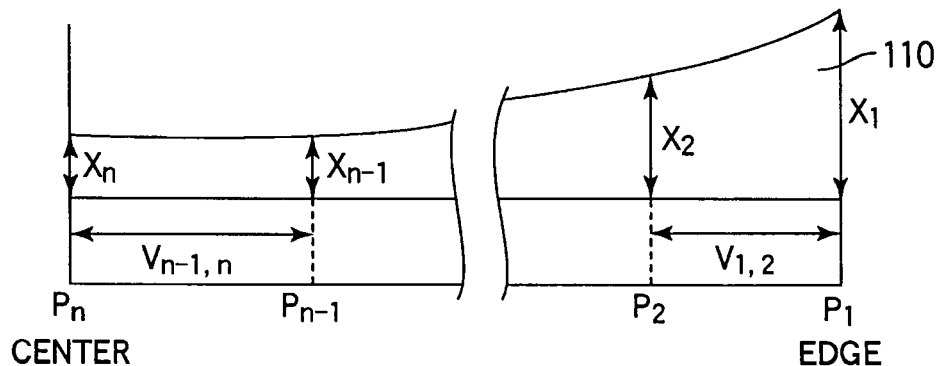
FIGS. 5A to 5E are views showing steps of a dissolving process for an oxide film having a cone-shaped recess profile.

At first, as shown in FIG. 5A, with reference to the film thickness detection points P1 to Pn between the peripheral edge and center of the wafer W, traveling velocities (v1,2 to vn−1,n) of the first liquid delivery nozzle 21 between the respective points are calculated to perform planarization by etching with etching amounts X1 to Xn. This calculation can be performed by a method disclosed in paragraph 5, line 31 to paragraph 6, line 52 in U.S. Pat. No. 6,096,233, the teachings of which are incorporated herein by reference.

Figure 5B:
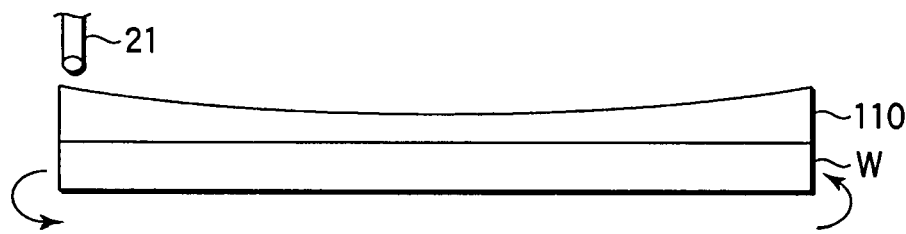
Figure 5C:
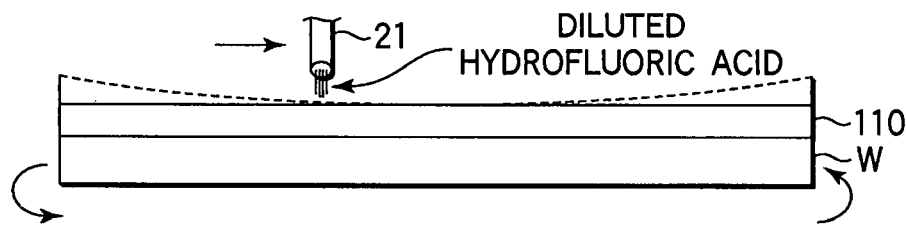

Then, as shown in FIG. 5B, the first liquid delivery nozzle 21 is set at a position above the end of the wafer W. Then, as shown in FIG. 5C, while the wafer W is rotated, the first liquid delivery nozzle 21 is moved for scanning toward the center with the velocities obtained as described above. During this scanning, a solution of diluted hydrofluoric acid is delivered from the first liquid delivery nozzle 21 to etch (dissolve) the oxide film, thereby planarizing the oxide film. At this time, the etching amount is preferably set to be the minimum amount necessary for the planarization. When the first liquid delivery nozzle 21 reaches the center, the supply of diluted hydrofluoric acid from the first liquid delivery nozzle 21 is stopped. In the step described above, the rotation number of the wafer W is preferably set to be 100 to 1,000 rpm. The wafer W is kept rotated in a series of steps from this step to the subsequent steps.

Figure 5D:
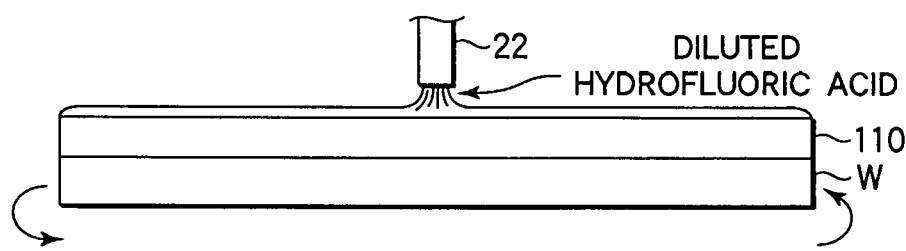

Thereafter, as shown in FIG. 5D, the first liquid delivery nozzle 21 is retreated, and the second liquid delivery nozzle 22 is set at a position above the center of the wafer W. In this state, a solution of diluted hydrofluoric acid is supplied from the second liquid delivery nozzle 22 to the entire surface of the wafer W. Consequently, etching is uniformly performed all over the wafer W, so that the oxide film 110 is processed to have a predetermined uniform thickness.

Figure 5E:
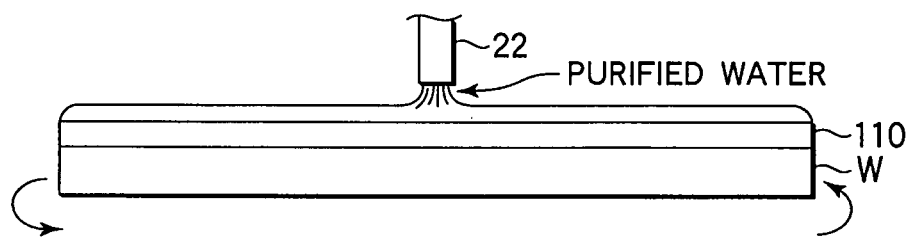

When the thickness of the oxide film 101 becomes a predetermined value, the supply of diluted hydrofluoric acid from the second liquid delivery nozzle 22 is stopped. Further, as shown in FIG. 5E, purified water used as a rinsing liquid is supplied from the second liquid delivery nozzle 22 to terminate the etching.

With the steps described above, the oxide film 110 is planarized to have a predetermined thickness.

According to this process, since the first liquid delivery nozzle 21 has a smaller diameter and delivers a liquid at a smaller flow rate, it is possible to accurately control the liquid supply point, when diluted hydrofluoric acid used as a process liquid is delivered to perform etching. Consequently, in spite of the presence of the support pins 12a and hold pins 12b serving as a wafer chuck, the thickness of the oxide film 110 can be accurately controlled at the peripheral portion of the wafer W. Further, since such a nozzle having a smaller diameter is used, the consumption of diluted hydrofluoric acid used as a process liquid can be decreased. Furthermore, since the first liquid delivery nozzle 21 is inclined to deliver a liquid in the rotational direction of the wafer W, the relative liquid velocity is decreased, thereby suppressing liquid flicks and/or liquid spread, and thus minimizing undesirable etching.

On the other hand, there is a fear that the throughput is decreased due to use of such a liquid delivery nozzle having a smaller diameter and providing a smaller flow rate. However, after the first liquid delivery nozzle 21 having a smaller diameter and providing a smaller flow rate is used to planarize a film, the second liquid delivery nozzle 22 having a larger diameter and providing a larger flow rate is used. Specifically, the second liquid delivery nozzle 22 is set at a position above the center of the wafer W and is used to supply the process liquid all over the wafer W to promote the etching. Consequently, it is possible to etch the oxide film at a high rate, thereby minimizing decrease in throughput.

In the example described above, when the process liquid is delivered, the first liquid delivery nozzle 21 is moved for scanning from the peripheral edge of the wafer W toward the center, while the wafer W is rotated. In reverse, when the process liquid is delivered, the first liquid delivery nozzle 21 may be moved for scanning from the center of the wafer W toward the peripheral edge, while the wafer W is rotated. Also in this case, traveling velocities of the first liquid delivery nozzle 21 between the respective film thickness detection points are calculated. This calculation can be performed by a method disclosed in paragraph 8, line 32 to paragraph 9, line 57 in U.S. Pat. No. 6,096,233, the teachings of which are incorporated herein by reference. This latter example provides the same effect as that of the former example.

Figure 6:
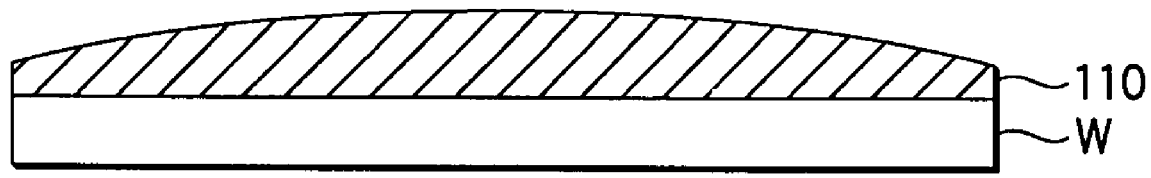
FIG. 6 is a view showing a case where an oxide film formed on a wafer has a thickness smaller at the peripheral edge than at the center, which defines a cone-shaped projection profile.

Next, an explanation will be given of a case where the oxide film 110 has a cone-shaped projection profile. As described above, the film thickness is measured by the film thickness sensor 5 at a plurality of points between the center and peripheral edge of the wafer W, to obtain a profile of the film thickness. As a result of the measurement, as shown in FIG. 6, if the oxide film 110 formed on the wafer W has a thickness smaller at the peripheral edge than at the center, which defines a cone-shaped projection profile, the etching process is performed in accordance with the steps shown in FIGS. 7A to 7E.

Figure 7A:
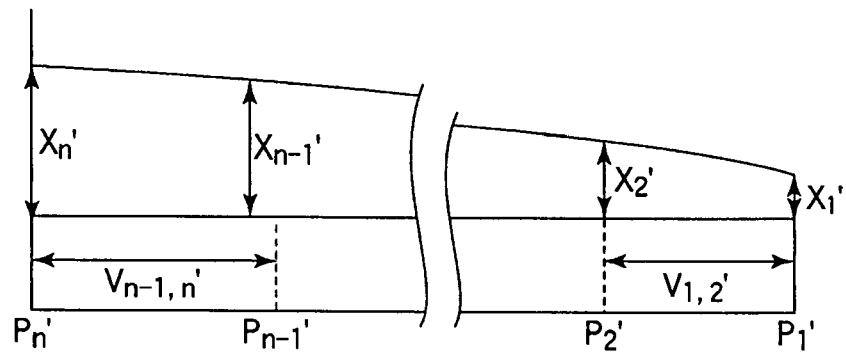
FIGS. 7A to 7E are views showing steps of a dissolving process for an oxide film having a cone-shaped projection profile.

At first, as shown in FIG. 7A, with reference to the film thickness detection points P1' to Pn' between the peripheral edge and center of the wafer W, traveling velocities (v1,2' to vn−1,n') of the first liquid delivery nozzle 21 between the respective points are calculated to perform planarization by etching with etching amounts X1 to Xn. It should be noted that, in this case, the traveling velocities thus calculated are used in the purified water rinsing step, because the etching is first uniformly performed all over the film, and is then performed by use of differences in timing for supplying purified water used as a rinsing liquid. This calculation can be performed by a method based on the corresponding method disclosed in U.S. Pat. No. 6,096,233, the teachings of which are incorporated herein by reference.

Figure 7B:
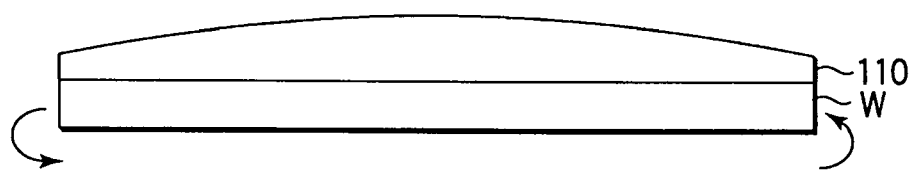
Figure 7C:
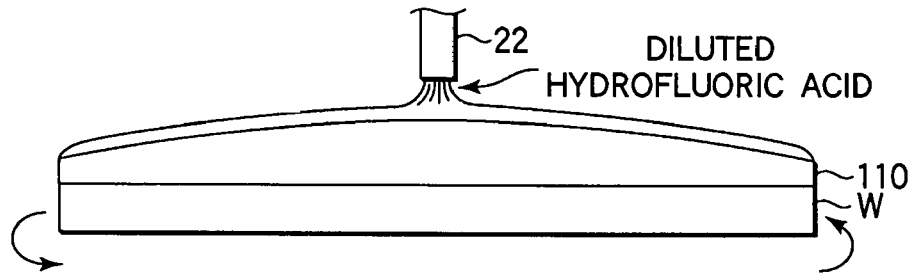
Figure 7D:
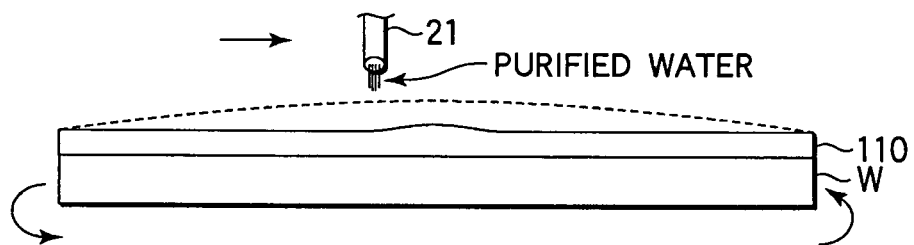

Then, as shown in FIG. 7B, the second liquid delivery nozzle 22 is set at a position above the center of the wafer W. In this state, as shown in FIG. 7C, while the wafer W is rotated, a solution of diluted hydrofluoric acid is supplied from the second liquid delivery nozzle 22 onto the wafer W to uniformly etch the oxide film 110. After the etching is performed by a predetermined amount, the second liquid delivery nozzle 22 is retreated, and the first liquid delivery nozzle 21 is set at a position above the end of the wafer W. Then, as shown in FIG. 7D, while the wafer W is rotated, the first liquid delivery nozzle 21 is moved for scanning toward the center with the velocities obtained as described above. During this scanning, purified water used as a rinsing liquid is delivered from the first liquid delivery nozzle 21 to sequentially stop the etching. With this operation, since the etching is sequentially stopped from a position corresponding to the end of the wafer toward the center, the etching is promoted at the most at the center of the wafer W. In light of this, the scanning velocity of the first liquid delivery nozzle 21 is suitably controlled to planarize the oxide film, so that the oxide film 110 is processed to have a uniform thickness. At this time, the etching is controlled to stop at a predetermined position of the oxide film 110 by the scanning of purified water provided by the first liquid delivery nozzle 21.

Figure 7E:
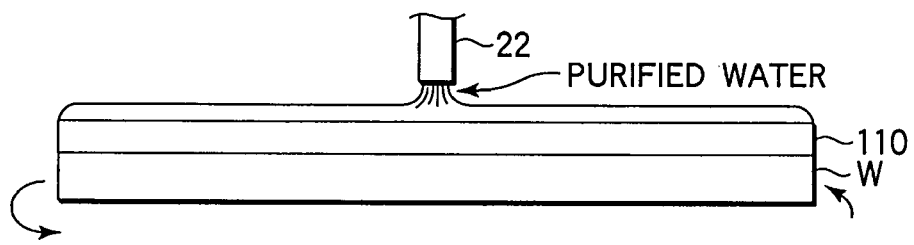

Then, the supply of purified water from the first liquid delivery nozzle 21 is stopped, and the first liquid delivery nozzle 21 is retreated. Then, as shown in FIG. 7E, the second liquid delivery nozzle 22 is set at a position above the center of the wafer W. In this state, purified water used as a rinsing liquid is supplied from the second liquid delivery nozzle 22 to completely terminate the etching all over the wafer W.

With the steps described above, the oxide film 110 is planarized to have a predetermined thickness.

According to this process, at first, the second liquid delivery nozzle 22 having a larger diameter and providing a larger flow rate is used to etch the oxide film 110 by a certain depth, while maintaining the cone-shaped projection profile. Then, the first liquid delivery nozzle 21 having a smaller diameter and providing a smaller flow rate is used to stop the etching sequentially from a position corresponding to the end of the wafer W. Consequently, it is possible to accurately control the liquid supply point, and thus to accurately control the thickness of the oxide film 110 at the peripheral portion of the wafer W, in spite of the presence of the support pins 12a and hold pins 12b serving as a wafer chuck. Further, since such a nozzle having a smaller diameter is used, the consumption of purified water can be decreased. Furthermore, since the first liquid delivery nozzle 21 is inclined to deliver a liquid in the rotational direction of the wafer W, the relative liquid velocity is decreased, thereby suppressing flicks and/or spread of purified water, and thus minimizing deterioration in the uniformity of etching due to uneven etching stoppage.

Figure 8:
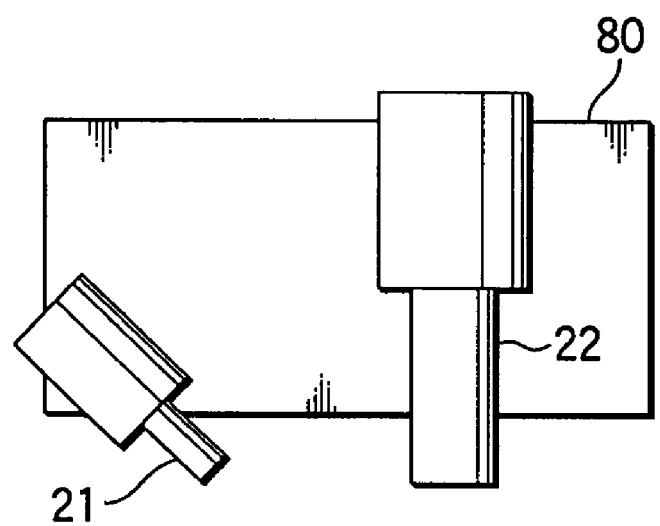
FIG. 8 is a view schematically showing an example where a first liquid delivery nozzle is integratedly combined with a second liquid delivery nozzle.

The present invention is not limited to the embodiment described above, and it may be modified in various manners without departing from the spirit or scope of the present invention. For example, in the embodiment described above, the first liquid delivery nozzle 21 and second liquid delivery nozzle 22 are separately disposed, but these nozzles may be integratedly disposed in one nozzle holder 80, as shown in FIG. 8. Further, additional nozzle may be used for delivering a liquid or gas other than the film dissolving process liquid and rinsing liquid. In the embodiment described above, an oxide film is a target film for a dissolving process (etching), but another film, such as a nitride film or metal film, may be processed in the same way. The process liquid is exemplified by diluted hydrofluoric acid, but another liquid may be used as long as it can be used for a dissolving process. The apparatus described above is provided with a film thickness sensor disposed therein, but the thickness of a film may be measured outside the apparatus and then stored in the storage portion 103. Further, the film thickness sensor is not indispensable, and a dissolving process may be performed in accordance with empirical values conventionally known. In the embodiment described above, the target object is exemplified by a semiconductor wafer, but it may be another substrate, such as a substrate for flat panel display devices (FPD), a representative of which is a glass substrate for liquid crystal display devices (LCD).

What is claimed is:

1. A liquid processing apparatus arranged to planarize a film on a substrate by supplying onto the film a process liquid for dissolving the film while rotating the substrate, the apparatus comprising:
    a substrate holding member configured to rotatably hold the substrate in a horizontal state;
    a rotation mechanism configured to rotate the substrate holding member; and
    a liquid supply mechanism configured to supply the process liquid onto a surface of the substrate,
    wherein the liquid supply mechanism includes a first liquid delivery nozzle and a second liquid delivery nozzle, which are configured to deliver said process liquid, such that the first delivery nozzle has a first nozzle diameter and is inclined to deliver the process liquid in a rotational direction of the substrate, and moveable between a center of the substrate and a peripheral edge thereof, and the second liquid delivery nozzle has a second nozzle diameter larger than a first nozzle diameter, and
    wherein the liquid supply mechanism provides correction etching to level a film thickness by supplying the process liquid at a first flow rate from the first liquid delivery nozzle onto the film, moving the first liquid delivery nozzle between the center of the substrate being rotated and the peripheral edge thereof at traveling velocities determined for respective zones in accordance with a film thickness profile of the film obtained in advance, and
    allover etching to decrease the film thickness as a whole by supplying the process liquid at a second flow rate larger than the first flow rate from the second liquid delivery nozzle onto the film on the substrate being rotated.

2. The liquid processing apparatus according to claim 1, wherein the apparatus further comprises a film thickness sensor configured to detect thickness of the film, so as to obtain the film thickness profile.

3. The liquid processing apparatus according to claim 2, wherein the apparatus further comprises means for determining the traveling velocities for respective zones in accordance with the film thickness profile.

4. The liquid process apparatus according to claim 1, wherein the first liquid delivery nozzle is inclined by an angle of 15 to 75°.

5. The liquid processing apparatus according to claim 1, wherein the first nozzle diameter is 0.2 to 2 mm and the first flow rate is 20 to 200 mL/min.

6. The liquid processing apparatus according to claim 1, wherein the second nozzle diameter is 3 to 5 mm and the second flow rate is 300 to 2,000 mL/min.

7. The liquid processing apparatus according to claim 1, wherein the first liquid delivery nozzle and the second delivery nozzle are integratedly disposed.

8. The liquid processing apparatus according to claim 1, wherein the first liquid delivery nozzle and the second delivery nozzle are integratedly disposed.

9. The liquid processing apparatus according to claim 1, wherein the second delivery nozzle is placed at the center of substrate when supplying the processing liquid.

10. A liquid processing apparatus arranged to planarize a film on a substrate by supplying onto the film a process liquid for dissolving the film while rotating the substrate, the apparatus comprising:
    a substrate holding member configured to rotatably hold the substrate in a horizontal state;
    a rotation mechanism configured to rotate the substrate holding member;
    a liquid supply mechanism configured to supply the process liquid onto a surface of the substrate, and
    a control mechanism configured to control an operation of the apparatus,
    wherein the liquid supply mechanism includes a first liquid delivery nozzle and a second liquid delivery nozzle, which are configured to deliver said process liquid, such that, the first delivery nozzle has a first nozzle diameter and is inclined to deliver the process liquid in a rotational direction of the substrate, and moveable between a center of the substrate and a peripheral edge thereof, and the second liquid delivery nozzle has a second nozzle diameter larger than a first nozzle diameter and
    wherein the control mechanism includes a non-transitory storage medium that stores a program for execution on a computer to control the apparatus, and said non-transitory storage medium is programmed to control the apparatus to conduct a sequence that comprises,
    performing correction etching of etching the film to level a film thickness of the film by supplying the process liquid at a first flow rate from the first liquid delivery nozzle onto the film, while moving the first liquid delivery nozzle between the center of the substrate being rotated and the peripheral edge thereof at traveling velocities determined for respective zones in accordance with a film thickness profile of the film obtained in advance, and
    performing allover etching of etching the film to decrease the film thickness of the film as a whole by supplying the process liquid at a second flow rate larger than the first flow rate from the second liquid delivery nozzle onto the film on the substrate being rotated.

11. The liquid processing apparatus according to claim 10, wherein the apparatus further comprises a film thickness sensor configured to detect thickness of the film, so as to obtain the film thickness profile.

12. The liquid processing apparatus according to claim 11, wherein the sequence further comprises determining the traveling velocities for respective zones in accordance with the film thickness profile.

13. The liquid process apparatus according to claim 10, wherein the first liquid delivery nozzle is inclined by an angle of 15 to 75°.

14. The liquid processing apparatus according to claim 10, wherein the first liquid delivery nozzle diameter is 0.2 to 2 mm and the first flow rate is 20 to 200 mL/min.

15. The liquid processing apparatus according to claim 10, wherein the second liquid delivery nozzle diameter is 3 to 5 mm and the second flow rate is 300 to 2,000 mL/min.

16. The liquid processing apparatus according to claim 10, wherein the second delivery nozzle is placed at the center of substrate when supplying the processing liquid.

17. A liquid processing apparatus arranged to planarize a film on a substrate by supplying onto the film a process liquid for dissolving the film while rotating the substrate, the apparatus comprising:
    a substrate holding member configured to rotatably hold the substrate in a horizontal state;
    a rotation mechanism configured to rotate the substrate holding member; and
    a liquid supply mechanism configured to supply the process liquid and purified water onto a surface of the substrate, wherein the liquid supply mechanism includes a first liquid delivery nozzle and a second liquid delivery nozzle, which are configured to selectively deliver said process liquid and said purified water, such that the first liquid nozzle has a first nozzle diameter and is inclined to deliver the process liquid in a rotational direction of the substrate and moveable between a center of the substrate and a peripheral edge thereof, and the second liquid delivery nozzle has a second nozzle diameter larger than a first nozzle diameter, and the liquid supply mechanism which provides allover etching of the film to decrease film thickness as a whole by supplying the process liquid at a main flow rate from the second liquid delivery nozzle onto the film on the substrate being rotated, and correction operation with the purified water to stop the film etching by the process liquid supplied from the second liquid delivery nozzle, so as to level the film thickness of the film, by supplying the purified water at a sub flow rate from the first liquid delivery nozzle onto the film, while moving the first liquid delivery nozzle between the center of the substrate being rotated and the peripheral edge thereof at traveling velocities determined for respective zones in accordance with a film thickness profile of the film obtained in advance.

18. The liquid processing apparatus according to claim 17, wherein the apparatus further comprises a film thickness sensor configured to detect thickness of the film, so as to obtain the film thickness profile.

19. The liquid processing apparatus according to claim 18, wherein the apparatus further comprises means for determining the traveling velocities for respective zones in accordance with the film thickness profile.

20. The liquid processing apparatus according to claim 17, wherein the first liquid delivery nozzle is inclined by an angle of 15 to 75°.

21. The liquid processing apparatus according to claim 17, wherein the second delivery nozzle is placed at the center of substrate when supplying the processing liquid.

22. A liquid processing apparatus arranged to planarize a film on a substrate by supplying onto the film a process liquid for dissolving the film while rotating the substrate, the apparatus comprising:

a substrate holding member configured to rotatably hold the substrate in a horizontal state;

a rotation mechanism configured to rotate the substrate holding member;

a liquid supply mechanism configured to supply the process liquid and purified water onto a surface of the substrate, and a control mechanism configured to control an operation of the apparatus, wherein the liquid supply mechanism includes a first liquid delivery nozzle and a second liquid delivery nozzle, which are configured to selectively deliver said process liquid and said purified water, such that the first liquid delivery nozzle has a first nozzle diameter and is inclined to deliver the process liquid in a rotational direction of the substrate and moveable between a center of the substrate and a peripheral edge thereof, and the second liquid delivery nozzle has a second diameter larger than a first nozzle diameter, and wherein the control mechanism includes a non-transitory storage medium that stores a program for execution on a computer to control the apparatus, and said non-transitory storage medium is programmed to control the apparatus to conduct a sequence that comprises, performing allover etching of etching the film to decrease a film thickness of the film as a whole by supplying the process liquid at a main flow rate from the second liquid delivery nozzle onto the film on the substrate being rotated, and performing correction operation of using the purified water to stop film being etched by the process liquid supplied from the second liquid delivery nozzle, so as to level the film thickness of the film, by supplying the purified water at a sub flow rate from the first liquid delivery nozzle on to the film, while moving the first liquid delivery nozzle between the center the center of the substrate being rotated and the peripheral edge thereof at a traveling velocities determined for the respective zones in accordance with a film thickness profile of the film obtained in advance.

23. The liquid processing apparatus according to claim 22, wherein the apparatus further comprises a film thickness sensor configured to detect thickness of the film, so as to obtain the film thickness profile.

24. The liquid processing apparatus according to claim 23, wherein the sequence further comprises determining the traveling velocities for respective zones in accordance with the film thickness profile.

25. The liquid processing apparatus according to claim 22, wherein the first liquid delivery nozzle is inclined by an angle of 15 to 75°.

26. The liquid processing apparatus according to claim 22, wherein the second delivery nozzle is placed at the center of substrate when supplying the processing liquid.

* * * * *